US008441257B2

(12) United States Patent
Mordini et al.

(10) Patent No.: US 8,441,257 B2
(45) Date of Patent: May 14, 2013

(54) TIME RESOLVED SPIN LABELED MRI CINEANGIOGRAPHY

(75) Inventors: Federico E. Mordini, Chicago, IL (US); Ioannis Koktzoglou, Des Plaines, IL (US); Robert R. Edelman, Highland Park, IL (US)

(73) Assignee: NorthShore University HealthSystem, Evanston, IL (US)

( * ) Notice: Subject to any disclaimer, the term of this patent is extended or adjusted under 35 U.S.C. 154(b) by 460 days.

(21) Appl. No.: 12/767,956

(22) Filed: Apr. 27, 2010

(65) Prior Publication Data

US 2011/0260725 A1    Oct. 27, 2011

(51) Int. Cl.
*G01V 3/00* (2006.01)

(52) U.S. Cl.
USPC ......................................................... 324/309

(58) Field of Classification Search ........... 324/300–322
See application file for complete search history.

(56) References Cited

U.S. PATENT DOCUMENTS

| RE32,701 | E | 6/1988 | Moran |
| 5,417,213 | A | 5/1995 | Prince |
| 5,713,358 | A | 2/1998 | Mistretta |
| 6,487,435 | B2 | 11/2002 | Mistretta |
| 6,498,946 | B1 * | 12/2002 | Foo et al. ...................... 600/410 |
| 6,954,067 | B2 | 10/2005 | Mistretta |
| 7,412,277 | B1 * | 8/2008 | Saranathan et al. .......... 600/413 |
| 7,519,412 | B2 | 4/2009 | Mistretta |
| 7,546,155 | B2 * | 6/2009 | Foo et al. ...................... 600/410 |
| 7,579,834 | B2 * | 8/2009 | Yui .............................. 324/307 |
| 7,906,963 | B2 * | 3/2011 | Yui .............................. 324/307 |
| 7,965,079 | B2 * | 6/2011 | Furudate ....................... 324/306 |
| 8,076,935 | B2 * | 12/2011 | Kitane et al. .................. 324/307 |
| 8,086,297 | B2 * | 12/2011 | Rehwald et al. ............. 600/420 |
| 8,121,668 | B2 * | 2/2012 | Sutton et al. ................. 600/419 |
| 8,165,371 | B2 * | 4/2012 | Bi et al. ....................... 382/128 |

OTHER PUBLICATIONS

Sallustio et al, Assessment of Intracranial Collateral Flow by Using Dynamic Arterial Spin Labeling MRA and Transcranial Color-Coded Duplex Ultrasound, Stroke, 2008; 39:1894-97.
Warmuth et al "Dynamic Spin Labeling Angiography in Extracranial Carotid Artery Stenosis," AJNR Am J Neuroradiol, 2005; 26:1035-43.
Korosec F et al, "Time-Resolved Contrast-Enhanced 3D MR Angiography", Magn. Reson. Med. 1996; 36:345-351.
F. E. Boada, et al.;"Fast Three Dimensional Sodium Imaging", MRM, 37:706-715, 1997.
Pipe et al, "Spiral Projection Imaging: a new fast 3D trajectory", Proc. Intl. Soc. Mag. Reson. Med. 13 (2005).

(Continued)

*Primary Examiner* — Dixomara Vargas
(74) *Attorney, Agent, or Firm* — Quarles & Brady, LLP

(57) ABSTRACT

A sequence of magnetic resonance images of the beating heart depicts the flow of blood through the heart chambers. Blood appears bright and background tissues are darkened by acquiring MR data following a preparatory pulse sequence in which spin magnetization throughout the field of view is inverted using a non-selective RF inversion pulse and spin magnetization in a selected pool of blood moving into the heart is re-inverted by a selective RF inversion pulse.

11 Claims, 3 Drawing Sheets

OTHER PUBLICATIONS

Edelstein et al., "Spin-Warp MR Imaging and Applications to Human Whole-Body Imaging", Physics in Medicine and Biology, vol. 25, pp. 751-756 (1980).

Katoh et al, "Local re-inversion coronary MR angiography: arterial spin-labeling without the need for subtraction," J. Magn. Reson. Image 2008; 27; 913-7.

Miyazaki et al, "Nonenhanced MR Angiography," Radiology 2008.

Griebe et al, "Close correlation of ASL MRI and ultrasound derived intracranial blood flow velocities," Proc. Intl. Soc. Mag. Reson. Med. 14 (2006).

K. V. Koladia et al; "Rapid 3D PC-MRA Using Spiral Projection Imaging", Proc. Intl. Soc. Magn. Reson. Med. 13 (2005).

* cited by examiner

TIME RESOLVED SPIN LABELED MRI CINEANGIOGRAPHY

BACKGROUND OF THE INVENTION

The field of the invention is magnetic resonance imaging ("MRI") methods and systems. More particularly, the invention relates to producing MRI images of blood flowing into moving subjects such as the beating heart without the use of contrast agents.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

In MRI systems, the excited spins induce an oscillating sine wave signal in a receiving coil. The frequency of this signal is near the Larmor frequency, and its initial amplitude, $A_0$, is determined by the magnitude of the transverse magnetic moment $M_t$. The amplitude, A, of the emitted NMR signal decays in an exponential fashion with time, t. The decay constant $1/T^*2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor that contributes to the amplitude A of the NMR signal is referred to as the spin-lattice relaxation process that is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1 DFT of each radial projection view and then transforming the Radon space data set to image space by performing a filtered backprojection.

Magnetic resonance angiography (MRA) uses the magnetic resonance phenomenon to produce images of the human vasculature. To enhance the diagnostic capability of MRA a contrast agent such as gadolinium can be injected into the patient prior to the MRA scan. As described in U.S. Pat. No. 5,417,213 the trick with this contrast enhanced (CE) MRA method is to acquire the central k-space views at the moment the bolus of contrast agent is flowing through the vasculature of interest. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as 6 seconds.

When the timing of peak contrast is difficult to perform, dynamic acquisitions are performed in which a series of image frames are acquired. Dynamic acquisitions typically require the use of acquisition sequences of either low spatial resolution or very short repetition times (TR). Short TR acquisition sequences may severely limit the signal-to-noise ratio (SNR) of the acquired images relative to those exams in which longer TRs are possible. One such method using a 3D "Fourier" acquisition is described by Korosec F., Frayne R, Grist T, Mistretta C., "Time-Resolved Contrast-Enhanced 3D MR Angiography", *Magn. Reson. Med.* 1996; 36:345-351 and in U.S. Pat. No. 5,713,358. When such a dynamic study is performed the time resolution of the study is determined by how fast the k-space data can be acquired for each image frame. This time resolution objective is often compromised in order to acquire all the k-space data needed to produce image frames of a prescribed resolution without undersampling artifacts.

Efforts have been made to acquire CEMRA images in shorter scan times using undersampled projection reconstruction scanning methods. As described in U.S. Pat. No. 6,487, 435, it was discovered that image artifacts due to k-space undersampling are unsubstantial when radial acquisitions are used. This is particularly true of CEMRA image frames in which a pre-contrast mask image is subtracted from each acquired image frame. Further reduction in scan time can be achieved by further undersampling each image frame and reconstructing the image frame using a HYPR reconstruction method as described in U.S. Pat. No. 7,519,412 issued on Apr. 14, 2009.

There are a number of issues presented when a CEMRA method is used. First, repeat imaging is limited because residual contrast agent remains in the patient's vasculature for an extended time. There are also dose concerns when using contrast agents, particularly with subjects having renal insufficiency. Most CEMRA methods also rely on acquiring a pre-contrast mask image and subtraction of the mask from the CEMRA images to suppress background tissues. This subtraction step is problematic when imaging a moving subject such as the beating heart since the two images must be aligned.

An MRA method which does not employ a contrast agent has been developed that encodes spin motion into the phase of the acquired signal as disclosed in U.S. Pat. No. Re. 32,701. These form a class of MRA techniques known as phase contrast (PC) methods. Currently, most PC techniques acquire two images, with each image having a different sensitivity to the same velocity component. Images may then be produced by forming either the phase difference or complex difference between the pair of velocity-encoded images. This motion encoding method is used to image flowing blood in what is commonly referred to as phase contrast magnetic resonance angiography (PCMRA). Phase contrast techniques such as that described in U.S. Pat. No. 6,954,067 have also been used to image flow and provide quantitative measurement of blood flow. In flow imaging the motion encoding gradients used during the scan are sensitive to velocity components in two or three orthogonal directions. From the resulting velocity component images, total quantitative flow images can be produced.

Phase contrast techniques have several shortcomings in a clinical setting. The encoding of motion into the phase of the acquired data requires the application of velocity encoding gradients whose magnitude determines the sensitivity. This velocity encoding gradient setting is a user prescribed parameter (VENC) that is often problematic. A low VENC setting may lead to aliasing of higher velocity spin measurements rendering the directionality of flow difficult to determine. A high VENC setting on the other hand may lead to inadequate sensitivity to low velocity spin motion such as jets that enable the detection of intracardiac shunts. Furthermore, the angle of the prescribed imaging plane needs to be perpendicular to the flow of interest for quantitative analysis or parallel to the frequency direction for qualitative analysis which adds to the technical difficulty of acquisition and produces unusual imaging angles that frequently lead to wrap artifact. Phase contrast techniques also produce complex flow patterns which may be difficult to interpret and difficult to separate from background tissues.

A number of methods have been developed for "tagging" or "labeling" flowing blood prior to flow into a region of interest that do not employ contrast agents or velocity encoding gradients. One such method is referred to as the arterial spin labeling (ASL) family of techniques. These techniques have been used to detect and provide a quantitative measure of blood flow to the brain and depiction of cerebral vasculature as described, for example, by Sallustio et al "Assessment of Intracranial Collateral Flow By Using Dynamic Arterial Spin Labeling MRA and Transcranial Color-Coded Duplex Ultrasound," *Stroke*, 2008; 39:1894-97; and by Warmuth et al "Dynamic Spin Labeling Angiography In Extracranial Carotid Artery Stenosis," *AJNR Am J Neuroradiol*, 2005; 26:1035-43. In conventional ASL, arterial blood is tagged by magnetic inversion or saturation proximal to a region of interest (ROI) to be imaged. That is, ASL techniques tag blood some distance away from the slice or volume of interest to be imaged. The tagged blood flows into the ROI and the inflow is detected as a modulation of the spin's longitudinal magnetization. This is seen on the reconstructed image as a dark region or a bright region depending on the particular ASL method used.

To create an image of flow, most ASL methods acquire one image with tagged blood and one with untagged (control) blood and subtract the two images. The successfulness of implementing an ASL technique depends, therefore, on accurately aligning the two subtracted images. Such accurate alignment is possible when imaging the head, but problematic when imaging moving subjects such as the beating heart.

SUMMARY OF THE INVENTION

The present invention is a method for producing dynamic MR images of blood flowing into a moving subject such as the beating heart. More particularly, the method includes acquiring a series of images following a preparatory pulse sequence that includes application of a non-selective RF inversion pulse that inverts spin magnetization throughout the region of interest and application of a selective RF inversion pulse that re-inverts spin magnetization in a selected source of flowing blood. Cardiac and/or respiratory gating may be used to enable each image to be acquired in a single movement cycle or in segments over many movement cycles. The non-selective RF inversion pulse suppresses longitudinal spin magnetization throughout the region of interest to suppress MR signals from background tissues and the selective RF inversion pulse re-inverts spin magnetization in a selected pool of moving spins upstream of the region of interest such that they produce significant MR signals (i.e., bright signals) as they flow into the region of interest during the following image data acquisitions. The series of reconstructed images thus depict the background tissues with diminished brightness and reveal the bright moving spins as they flow into the region of interest.

A general object of the invention is to facilitate the diagnosis of disease by depicting the flow of moving spins into and through a selected anatomical region. The method is particularly useful in diagnosing heart diseases by observing the flow of blood into and through the heart's chambers. The series of dynamic images may depict blood flow through the heart during one or more complete cardiac cycles.

A more specific objective of the invention is to avoid the use of MRA contrast agents and to avoid the use of motion encoding gradients which can produce overly complex velocity images that make diagnosis more difficult.

Another object of the invention is to provide dynamic MRA images which depict the flow of blood spins through moving anatomical structures such as the beating heart. Contrast is achieved between tagged blood spins and surrounding tissues by the double inversion pulse preparatory sequence, thus avoiding the need to acquire two aligned images that must be subtracted to produce contrast. This contrast persists with respect to untagged blood due to its longer T1 recovery time, but signals from other tissues recover more quickly to produce NMR signals that enable anatomical structures to be seen in the reconstructed images.

DESCRIPTION OF THE PREFERRED EMBODIMENT

Figure 1:
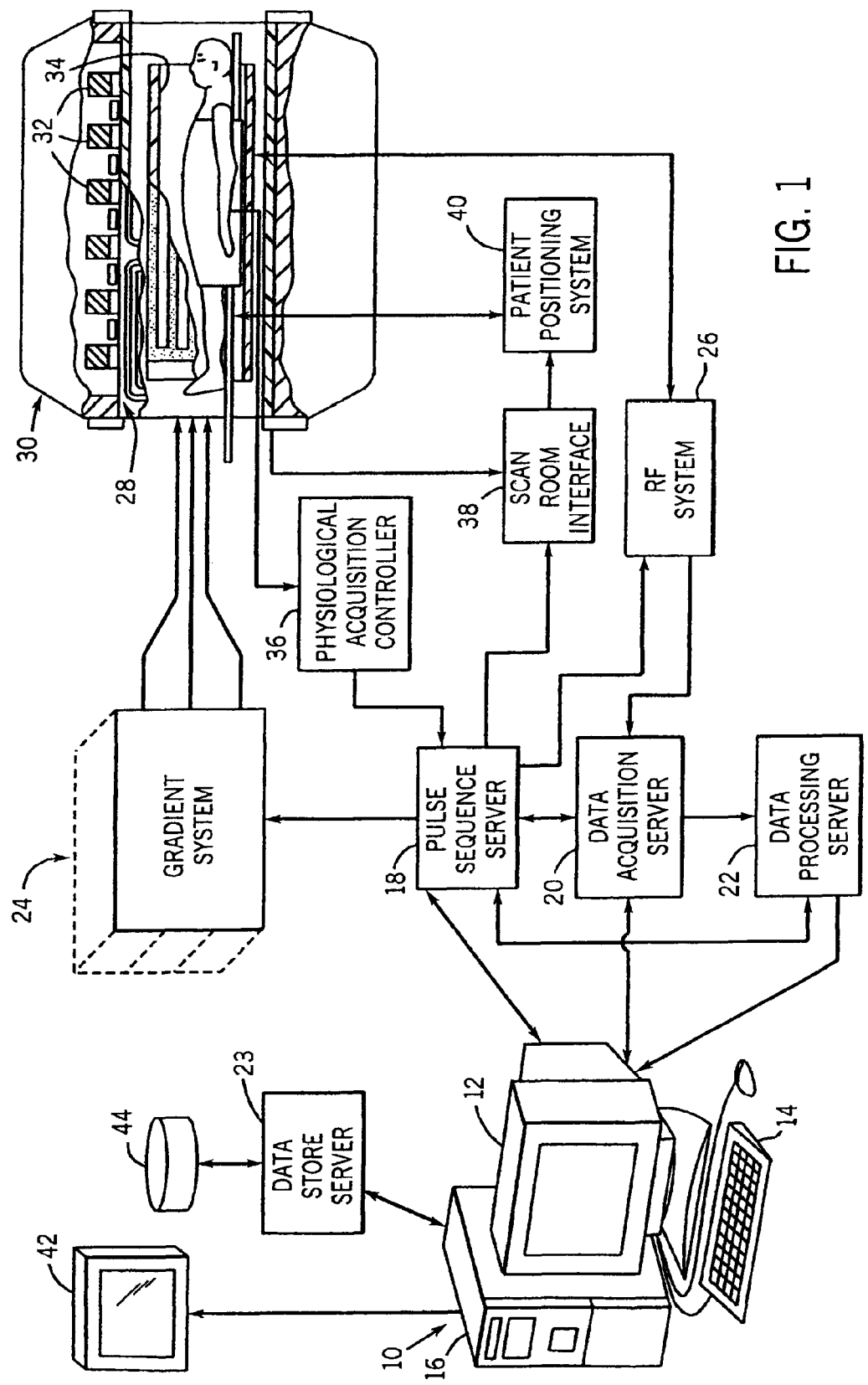
FIG. 1 is a block diagram of an MRI system that employs the present invention.

Referring to FIG. 1, the present invention is employed in an MRI system such as the 1.5T or 3.0T scanner manufactured by Siemens. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

The present invention is implemented on the above-described MRI system. This includes performing a pulse sequence illustrated in FIG. 2 and processing the acquired image data as depicted in the flow chart of FIG. 3.

Figure 2:
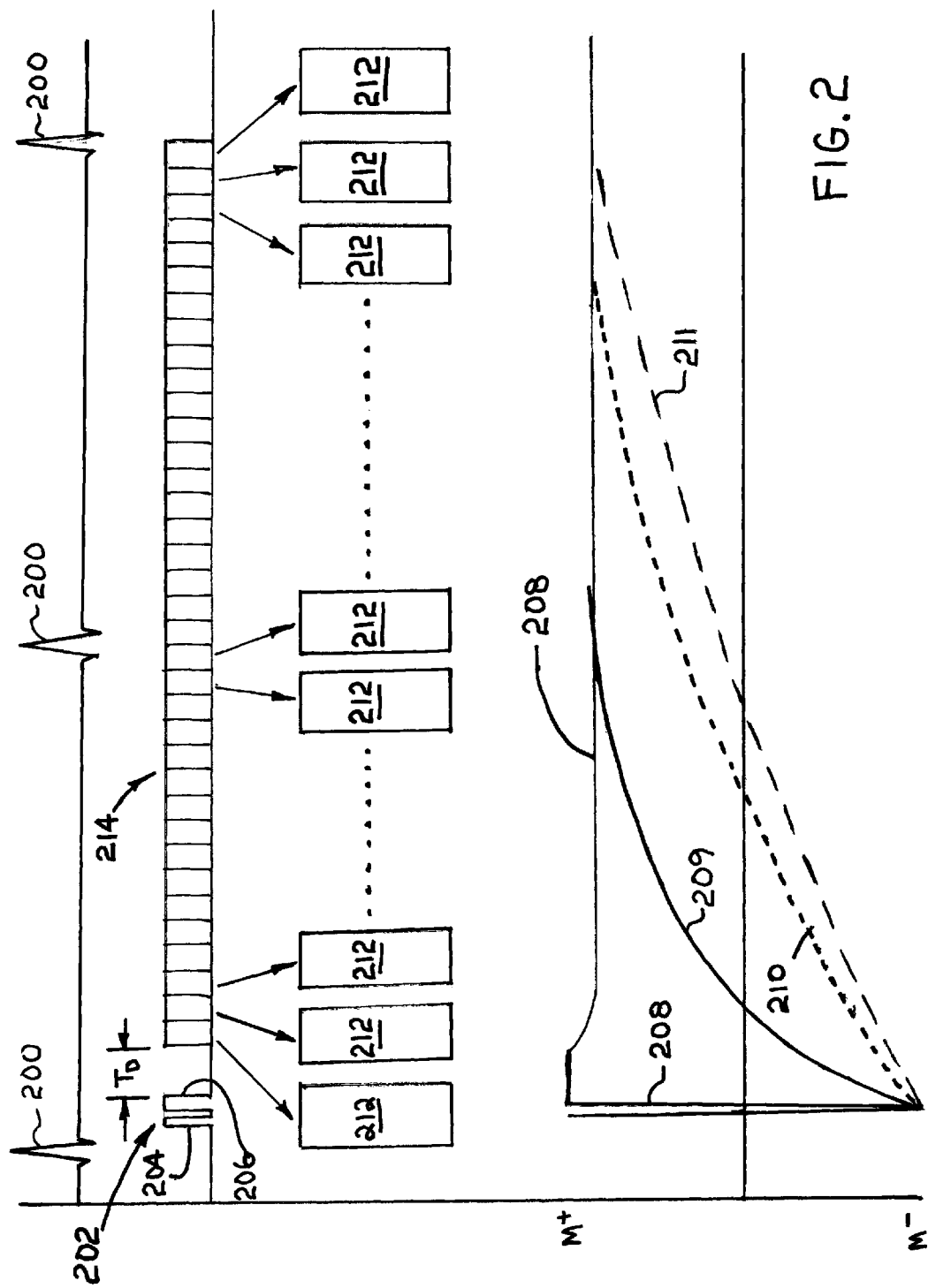
FIG. 2 is a graphic representation of the pulse sequence used to acquire MR data according to a preferred embodiment of the invention.

Referring particularly to FIG. 2, the pulse sequence employed in the preferred embodiment of the invention is used to acquire a plurality (typically between 20 and 40) of image frames of a beating heart. To synchronize the acquisition with the cardiac cycle, a cardiac gating signal triggered by the QRS complex 200 of the ECG signal is employed. This trigger signal initiates a preparatory pulse sequence 202 comprised of a non-selective 180° RF inversion pulse 204 that inverts longitudinal magnetization in spins located throughout the region of interest being imaged, followed by a selective 180° RF inversion pulse 206. The selective inversion pulse 206 is played in the presence of magnetic field gradients, which in combination re-invert longitudinal magnetization in a selected pool of blood spins located upstream of the region of interest in the heart to be imaged. As shown by the solid curve 208, the magnetization of the selected blood pool is thus inverted to a negative value by the non-selective inversion pulse 204 and then re-inverted to its original positive value by the second, selective inversion pulse 206. It is said to be "tagged". On the other hand, all of the remaining spin magnetization, and particularly, blood outside the selected pool and tissues of the heart and surrounding region, are inverted to a negative value.

Following the preparatory pulse sequence 202 the spin magnetization of background tissues recovers over a period of time as determined by their $T_1$ relaxation constants. As illustrated by curve 209, the signals from inverted fat spins recover very rapidly with the result that fat appears bright in nearly all the acquired image frames. Other background tissues such as myocardial tissue recover less rapidly as indicated by dotted curve 210, but these spins do produce enough signal, particularly during the second heartbeat, to be seen in the corresponding reconstructed image frames. The last to recover is the untagged blood due to its longer $T_1$ recovery time as indicated by dashed curve 211.

During the inflow of tagged blood, data is acquired for a series of image frame data sets indicated at 212 at successive cardiac phases throughout two cardiac cycles. During this acquisition, the magnetization of the spins in the selected blood pool remains at a relatively high equilibrium value indicated by solid curve 208 to produce strong MR signals in the acquired image frames. On the other hand, during this same acquisition period, the magnetization of untagged blood spins remains much lower than this equilibrium value with the result that their MR signals are lower and the corresponding untagged blood appears darker in the reconstructed image frames. This difference provides the contrast which enables the brighter flowing blood from the selected blood pool to be distinguished from untagged blood. On the other hand, the signals from background tissues such as the myocardium are strong enough such that anatomical structures can be seen in all the reconstructed image frames. This is very important from a diagnostic standpoint since flow patterns can be related to structural features and defects and the volume of blood flow through particular structures can be assessed.

The location of the selected, or tagged, blood pool is determined by the location of the particular region of interest being examined. For example, a blood pool in the pulmonary veins is selected and visualized as it enters the left atrium of the heart whereas a blood pool in the inferior vena cava is selected and visualized as it enters the right atrium.

Referring still to FIG. 2, the data acquisition phase of the procedure begins at a time interval $T_D$ after the preparatory pulse sequence as indicated at 214. In the preferred embodiment, a two-dimensional, balanced steady-state free precession imaging pulse sequence known as TrueFISP is employed to acquire each view of k-space data. Preferred scan parameters for this pulse sequence are a TR of 2.7 ms, a TE of 1.3 ms, a flip angle of 63 degrees, and a temporal resolution of 46 ms, although a wide range of values may be used with this method. An image frame having a slice thickness of 6-8 mm and a field of view of 340 cm by 255 cm is acquired by repeating the pulse sequence to sample a 128×128 matrix of k-space.

MR k-space data for a plurality of image frames is acquired (typically 20 to 40) during each data acquisition phase 214. The acquisition 214 is segmented in that only a portion of the total k-space required to reconstruct an image frame is acquired during each acquisition phase 214. In the preferred embodiment the bSSFP pulse sequence is repeated to acquire 18 views during each segment and the acquired k-space data for each segment is stored in the data set 212 for the corresponding image frame. As indicated above, segments are acquired over two cardiac cycles and stored in the corresponding image frame data sets 212.

The pulse sequence comprised of the preparatory pulse sequence 202 and acquisition phase 214 is then repeated to acquire additional segments of k-space data for each image frame data set 212. This repeats to acquire a total of 128 segments for each image frame data set 212. Each reconstructed image frame 212 depicts the heart at a specific cardiac phase determined by the location of its corresponding data acquisition segment in the heart cycle. When displayed in sequence, therefore, the image frames 212 depict the heart at successive cardiac phases throughout two heart beats.

Figure 3:
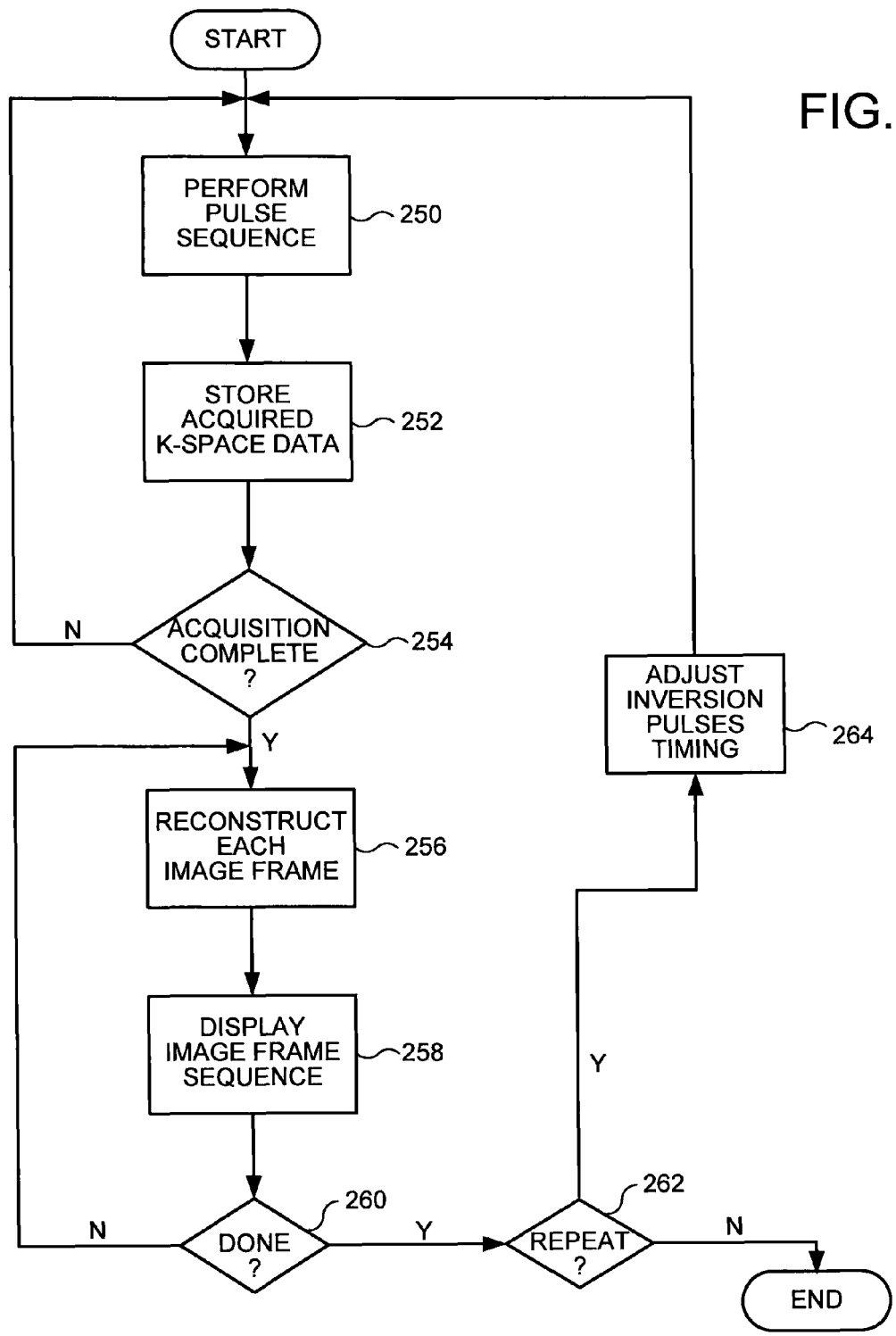
FIG. 3 is a flow chart of the steps employed in performing a preferred embodiment of the invention.

Referring particularly to FIG. 3, the operation of the MRI system according to the preferred embodiment includes performing the pulse sequence of FIG. 2 as indicated at process block 250. The acquired k-space data is stored in the respective image frame data sets 212 as indicated at process block 252. These steps are repeated until a sufficient number of segments have been acquired to reconstruct the image frames as indicated at decision block 254.

As indicated by process block 256, the image frames are then reconstructed by performing a 2DFT of the complex k-space data and calculating the magnitude at each pixel location. Separate phase images are also reconstructed from each image frame data set 212. This phase information can be used to darken image frame pixels when the untagged blood spin magnetization is inverted during the earlier acquired image frames. More specifically, if an image pixel has a negative phase, it is set dark regardless of its signal magnitude. The phase information can also be used during post-processing to identify the flow of the labeled blood and quantify the mixture of tagged and untagged blood on a voxel-by-voxel basis. The series of image frames are then displayed in sequence as indicated at process block 258, and the display sequence is repeated until the operator stops the process as indicated at decision block 260.

The image frames acquired and displayed in the above-described process each depict the heart at a specific cardiac phase determined by the location of its corresponding acquisition segment within the heart cycle. In addition, each image frame has a unique image contrast that is determined by the inversion recovery time between its acquisition segment and the preparatory pulse sequence 202. As indicated at decision block 262, the entire process can be repeated to produce another set of image frames in which the timing of the inversion pulses is changed as indicated at process block 264, and hence the image contrast is changed at each cardiac phase. This is useful in order to shift moments of peak contrast to different cardiac phases where the blood flow pattern may be more diagnostically revealing. For example, with the inversion pulse 204 and 206 following the QRS complex 200 as shown in FIG. 2, the detection and evaluation of intracardiac shunts as described in more detail below is facilitated. On the other hand, if the inversion pulses 204 and 206 are timed to occur before the QRS complex 200, other cardiac maladies such as valvular regurgitation may be detected and evaluated.

In the preferred embodiment described above, a single scan that acquires a plurality of (typically 20 to 40) image frames covering two cardiac cycles is completed in a single breath hold of from 12 to 14 seconds. Motion artifacts caused by respiratory motion are thus avoided. Many alternatives are possible, however, for the data acquisition phase of the procedure including the use of segmented FLASH or real-time GRE-EPI, FLASH or bSSFP. The acquisition phase can also be accelerated by using undersampling methods well known in the art. Such methods include, for example, parallel imaging methods such as SENSE or GRAPPA that enable fewer phase encoding views to be acquired for an artifact-free image reconstruction. Faster k-space sampling strategies such as 2D or 3D radial sampling along with under sampled image reconstruction methods such as the above-cited HYPR method may be employed to provide real-time or near real-time dynamic MR imaging of blood flow in the beating heart. In this implementation the acquisition may not be segmented to acquire imaging data during a plurality of cardiac cycles, but is instead acquired all at one interval. The pulse sequence is repeated many times and the series of image frames produced after each acquisition are displayed in near real time. In such an accelerated case, the subject motion need not be cyclical and multiple gated acquisitions are not required.

At present, there are few techniques to assess blood flow in the heart. This method provides a novel approach to visualize blood flow in the heart without the technical limitations of velocity parameters and without the shortcomings of intravenous contrast agents. It mimics the "agitated saline technique" that is used commonly in echocardiography, however, it can be applied exclusively in a specific vascular bed, or even to arterial vasculature structures which are accessible only by invasive means.

This technique is applicable to the detection and evaluation of intracardiac shunts including atrial septal defects (ASD), ventricular septal defects, and patent foramen ovale. One particular area where this technique is of potential utility is in the pre-procedural assessment of patients undergoing percutaneous ASD closure for determining proper candidates and for sizing of the closure device. The critical measurements for device sizing include size of the defect, margins of tissue surrounding the defect available for implantation, and size of the atria. These measurements are currently performed primarily by echocardiography which does not provide a volumetric view of the defect or alternatively by phase contrast MRI which is technically difficult since phase contrast separates flow from structure/function images. This method has a distinct advantage over phase contrast MRI in this setting since surrounding cardiac structures and blood flow are viewed simultaneously in the same image while enabling a volumetric assessment of the structures which echocardiography does not offer.

The method is anticipated to have a role in the assessment of valvular disease, particularly regurgitant valvular lesions. Although current methods for assessment of myocardial perfusion exist using a conventional ASL technique, the present method offers a dynamic time-resolved approach. Quantification of a flow is another potential application. Vascular applications include angiography of peripheral vessels in vascular beds affected by motion or visualization of arterio-venous fistula.

The invention claimed is:

1. A method for producing a series of image frames of a moving subject using a magnetic resonance imaging (MRI) system, the steps comprising:
   a) acquiring MR signals to form an image data set for each image frame by performing a pulse sequence with the MRI system, the pulse sequence including:
      a)i) a preparatory pulse sequence comprised of a non-selective RF inversion pulse that inverts spin magnetization throughout the field of view of the image frames and a selective RF inversion pulse that re-inverts spin magnetization in a pool of moving spins flowing into a region of interest within a field of view of each image frame; and
      a)ii) a plurality of image data acquisition pulse sequences performed in sequence after the preparatory pulse sequence to acquire the MR signals for the image data set for each image frame as the inverted spin magnetization in the field of view of each image frame recovers;
   b) reconstructing the image frames from the acquired image frame data sets; and
   c) displaying in sequence the reconstructed image frames to depict the flowing spins having re-inverted spin magnetization as they flow throughout the region of interest.

2. The method as recited in claim 1 in which the moving subject is a beating heart and the pool of moving spins is blood flowing into the heart.

3. The method as recited in claim 2 in which the performance of step a) is initiated by a cardiac gating signal such that each acquired image frame depicts the beating heart at a selected cardiac phase.

4. The method as recited in claim 3 in which the data acquisition in step a) is segmented such that only a portion of each image frame data set is acquired in step a)ii) and step a)i) and a)ii) are repeated to acquire the remaining portion of each image frame data set.

5. The method as recited in claim 2 in which the image frame data sets are acquired over substantially two cardiac cycles.

6. The method as recited in claim 1 in which the image data acquisition pulse sequence is a balanced, steady-state free precession pulse sequence.

7. The method as recited in claim 1 in which steps a) through c) are repeated to produce image frames in near real time.

8. A method for producing a series of image frames of a moving subject using a magnetic resonance imaging (MRI) system, the steps comprising:
   a) acquiring MR signals to form an image data set for each image frame by performing a pulse sequence with the MRI system, the pulse sequence including:
   a)i) a preparatory pulse sequence comprised of a non-selective RF inversion pulse that inverts spin magnetization throughout the field of view of the image frames and a selective RF inversion pulse that re-inverts spin magnetization in a pool of moving spins flowing into a region of interest within a field of view of each image frame; and
   a)ii) a plurality of image data acquisition pulse sequences performed in sequence after the preparatory pulse sequence to acquire the MR signals for the image data set for each image frame as the inverted spin magnetization in the field of view of each image frame recovers;
   b) reconstructing the image frames from the acquired image frame data sets; and
   c) displaying in sequence the reconstructed image frames to depict the flowing spins having re-inverted spin magnetization as they flow throughout the region of interest;
   in which each image frame data set substantially under samples k-space.

9. A method for producing a series of image frames of a moving subject using a magnetic resonance imaging (MRI) system, the steps comprising:
   a) acquiring MR signals to form an image data set for each image frame by performing a pulse sequence with the MRI system, the pulse sequence including:
   a)i) a preparatory pulse sequence comprised of a non-selective RF inversion pulse that inverts spin magnetization throughout the field of view of the image frames and a selective RF inversion pulse that re-inverts spin magnetization in a pool of moving spins flowing into a region of interest within a field of view of each image frame; and
   a)ii) a plurality of image data acquisition pulse sequences performed in sequence after the preparatory pulse sequence to acquire the MR signals for the image data set for each image frame as the inverted spin magnetization in the field of view of each image frame recovers;
   b) reconstructing the image frames from the acquired image frame data sets; and
   c) displaying in sequence the reconstructed image frames to depict the flowing spins having re-inverted spin magnetization as they flow throughout the region of interest;
   in which the image frame reconstruction in step b) includes:
   b)i) calculating the magnitude of the MR signal at each image frame pixel; and
   b)ii) controlling the brightness of each image frame pixel using the magnitude calculated in step b)i).

10. The method as recited in claim 9 in which step b) further includes:
    b)iii) calculating the phase of the MR signal at each image frame pixel; and
    b)iv) altering the brightness of image frame pixels produced in step b)ii) using the phase calculated in step b)iii).

11. The method as recited in claim 10 in which step b) further includes:
    b)v) producing a separate phase image for each image frame using the phase information produced in step b)iii).

* * * * *